US008254137B2

(12) United States Patent
Wilkolaski et al.

(10) Patent No.: US 8,254,137 B2
(45) Date of Patent: Aug. 28, 2012

(54) ELECTRONIC DEVICE USED IN A HEALTH CARE SETTING

(75) Inventors: Edward A. Wilkolaski, Lancaster, NY (US); Abhilash J. Prasad, Sloan, NY (US); Edgar P. Conrad, West Seneca, NY (US); John Waterhouse, Orchard Park, NY (US); Larry Hall, East Aurora, NY (US); Arthur P. Caprio, Orchard Park, NY (US); Christopher P. Camacho, Derby, NY (US)

(73) Assignee: Curbell Medical Products, Inc., Orchard Park, NY (US)

( * ) Notice: Subject to any disclaimer, the term of this patent is extended or adjusted under 35 U.S.C. 154(b) by 549 days.

(21) Appl. No.: 12/362,501

(22) Filed: Jan. 30, 2009

(65) Prior Publication Data

US 2010/0195295 A1 Aug. 5, 2010

(51) Int. Cl.
*H05K 7/14* (2006.01)

(52) U.S. Cl. .................... 361/752; 348/734; 340/286.07

(58) Field of Classification Search .................. 361/752; D14/207; 348/734
See application file for complete search history.

(56) References Cited

U.S. PATENT DOCUMENTS

| | | | | |
|---|---|---|---|---|
| 3,137,773 | A * | 6/1964 | Black | 200/5 E |
| 3,342,285 | A * | 9/1967 | Robbins | 181/153 |
| 4,680,790 | A * | 7/1987 | Packard et al. | 379/432 |
| 5,648,757 | A * | 7/1997 | Vernace et al. | 340/539.32 |
| 5,650,831 | A * | 7/1997 | Farwell | 348/734 |
| 6,215,665 | B1 * | 4/2001 | Martin | 361/737 |
| 6,658,132 | B1 * | 12/2003 | Moster et al. | 381/388 |
| 7,142,256 | B2 * | 11/2006 | Stoner et al. | 348/734 |
| 7,884,703 | B2 * | 2/2011 | Sowada et al. | 340/286.07 |
| 2008/0252793 | A1 * | 10/2008 | Choi et al. | 348/734 |

FOREIGN PATENT DOCUMENTS

WO WO 2006101647 A1 * 9/2006

* cited by examiner

*Primary Examiner* — Lisa Lea Edmonds
(74) *Attorney, Agent, or Firm* — Hodgson Russ LLP

(57) ABSTRACT

An electronic device for use in a health care setting has a rigid enclosure assembly formed by a rigid shell and a rigid printed circuit board carrying circuitry for operating the device. A switch dome layer and an overlay are independently attached to the device but not to each other, whereby the overlay may be removed without disturbing the dome layer and a better tactile response is achieved.

12 Claims, 3 Drawing Sheets

ELECTRONIC DEVICE USED IN A HEALTH CARE SETTING

FIELD OF THE INVENTION

The present invention is generally directed to an electronic device that is used in a health care setting, such as a hospital, nursing home, clinic, or similar environment. By way of example, the electronic device may be a hand-held pillow speaker kept at a patient's bedside for remotely controlling a television, room lights, or other electronic items in the room, and for communicating with nursing staff or other personnel.

BACKGROUND OF THE INVENTION

Many electronic control and/or or communication devices, including prior art pillow speakers found in hospital rooms, have a rigid enclosure assembly for physical protection and electrical isolation. For manufacturability, it is commonplace to create the rigid enclosure assembly by providing two complementary rigid shells, and screwing, clipping or gluing the shells together with a printed circuit board (PCB) and any other electronic components inside the rigid enclosure assembly.

Where the electronic device has user control buttons, these are typically incorporated into the device by a switch membrane mounted on one of the shells. A typical switch membrane either comprises the entire switch assembly and a wire harness to drive the signals to the PCB, or it includes the metal domes within its confines and adheres the domes to the PCB to create a normally open switch.

Electronic devices used in health care settings are used on a daily basis, and they are cleaned and disinfected often to prevent the spread of germs. They must be reliable for patient safety reasons. Consequently, they require service and repair more frequently than electronic devices used under less demanding circumstances.

Electronic devices formed according to the prior art are susceptible to damage not only from normal use, but also from liquid cleaning and disinfecting agents. Oftentimes, it is the switch membrane that is damaged, and the entire switch membrane must be removed and replaced, even though an outer graphic overlay of the switch membrane or metal switch domes of the switch membrane may be in perfect condition.

Switch membranes of the prior art, wherein the switch domes are attached to the overlay material, give the electronic device a tactile performance that is less than ideal due to the resistance to movement introduced by the overlay material.

What is needed is an improved electronic device assembly that is easier and less expensive to manufacture, allows for more efficient and less wasteful servicing, and responds better from a tactile standpoint to a user's pushbutton touches.

SUMMARY OF THE INVENTION

In a first aspect of the invention, an electronic device for use in a health care setting generally comprises a rigid shell defining an interior space and an opening communicating with the interior space, and a rigid PCB fixed to the shell to cover the opening. The rigid PCB includes electronic circuitry for operation of the device. The shell and PCB cooperate with one another to form a rigid enclosure assembly for the electronic device, thereby avoiding the need for a two-piece shell to enclose a separate PCB.

In a second aspect of the invention, an electronic device for use in a health care setting is improved by providing a physically separate dome layer and overlay. The dome layer may be fixed to an outward surface of the PCB and include a nonconductive sheet and a switch dome attached to the nonconductive sheet, wherein the switch dome is operable to close a switch trace on the PCB. The overlay may be arranged adjacent to the dome layer and fixed to a housing shell containing the PCB and/or to the outward surface of the printed circuit board, but the overlay is unattached to the dome layer. The overlay includes a switch graphic at a location corresponding to the switch dome.

The present invention extends to methods of making and servicing electronic devices embodying one or both of the aspects summarized above.

DETAILED DESCRIPTION OF THE INVENTION

Figure 1:
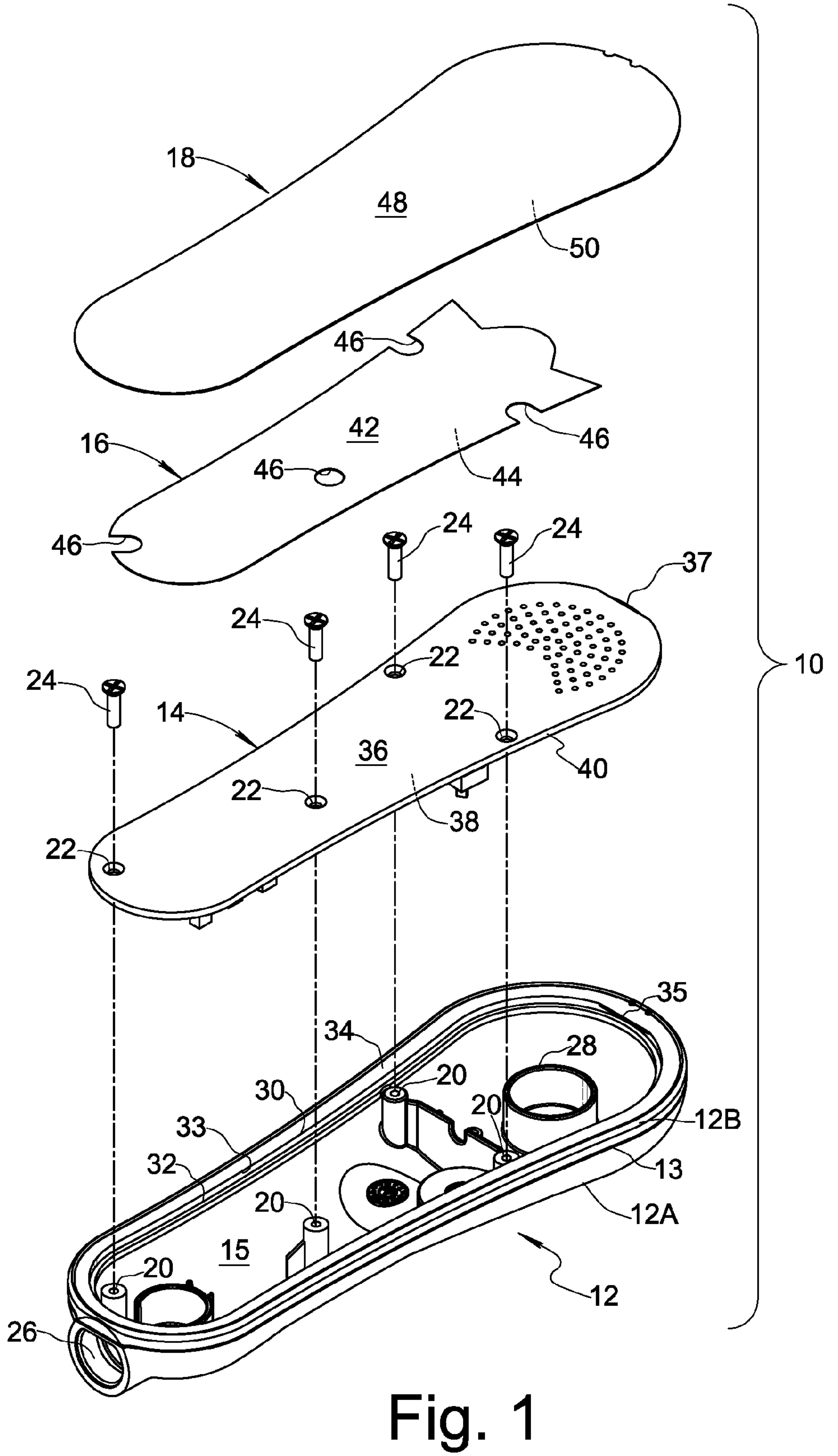
FIG. 1 is an exploded perspective view of an electronic device formed in accordance with an embodiment of the present invention.

FIG. 1 shows, in exploded view, a pillow speaker 10 formed in accordance with an embodiment of the present invention. Pillow speaker 10 is an electronic device for use in a health care setting, such as a hospital, nursing home, clinic, or similar environment. While the present invention is described with respect to a pillow speaker, it will be understood that other types of electronic devices used in health care settings may be constructed as taught herein. Examples of other types of electronic devices to which the present invention may be applied include, without limitation, handheld pendants, bed rails, wall plates, and call cords where a user interface is required.

Pillow speaker 10 generally comprises a rigid shell 12, a rigid PCB 14, a dome layer 16, and an overlay 18. Shell 12 defines an interior space 15 and an opening 30 communicating with the interior space. Shell 12 may include a plurality of fastener receptacles 20, a cord passageway 26 through which wires may pass to reach interior space 15, a speaker mount 28 for receiving an audio speaker (not shown), a support surface 32 for supporting PCB 14, an inner surface 33 generally orthogonal to support surface 32 in the region of the support surface, and a rim surface 34 around opening 30. Shell 12 may also include a retainer tab 35 protruding from rim surface 34 overtop support surface 32.

In the embodiment shown in FIG. 1, shell 12 is manufactured from a first shell portion 12A and a second shell portion 12B. The first and second shell portions 12A, 12B may each be molded of plastic, and then attached to one another to form rigid shell 12. It is advantageous that the shell be free of small openings through which moisture may penetrate. Shell portions 12A and 12B may be ultrasonically welded together, as evidenced by weld seam 13, to form rigid shell 12. Alternatively, a moisture sealing adhesive may be used to bond the shell portions together. Rigid shell 12 may also be formed in unitary fashion as a single piece of molded plastic.

Rigid PCB 14 is fixed to shell 12 by fasteners 24 extending through respective fastener holes 22 through PCB 14 and engaging fastener receptacles 20. Fasteners 24 may be threaded fasteners, and fastener receptacles 20 may be internally threaded to mate with a corresponding fastener 24. PCB 14 covers opening 30 and includes electronic circuitry (not shown) for operation of pillow speaker 10. In accordance with a first aspect of the present invention, shell 12 and PCB 14 cooperate with one another to form a rigid enclosure assembly for pillow speaker 10.

PCB 14 includes an inward surface 38 contacting support surface 32 of shell 12. As shown in FIG. 1, support surface 32 may be recessed relative to rim surface 34, such that a peripheral edge 40 of PCB 14 opposes inner surface 33 of the shell 12. In this arrangement, PCB acts as a rigid member providing structural integrity to the rigid enclosure assembly. For example, if pillow speaker 10 is subjected to an impact force as may happen if pillow speaker 10 is dropped to the floor, inwardly directed force applied to the outside of shell 12 may be opposed by rigid PCB 14. Applicants have found that a PCB thickness of 3.5 mm or greater will provide the rigid enclosure assembly with suitable structural integrity to withstand forces commonly encountered during normal use of the pillow speaker device. However, it will be understood that thickness is but one dimension of PCB 14, and PCB's that are less than 3.5 mm in thickness may be suitable for some applications. The word "rigid," as used herein to modify PCB, is intended to distinguish from flexible PCBs now on the market, and does not imply a minimum thickness requirement.

In the embodiment of FIG. 1, retainer tab 35 is arranged to engage a recessed portion 37 of an outward surface 36 of PCB 14. Retainer tab 35 and recessed portion 37 may be at corresponding longitudinal ends of shell 12 and PCB 14, respectively, whereby the retainer tab pushes down on the end of the circuit board such that an axial tension force is created in fasteners 24 when the fasteners are tightened.

Figure 2:
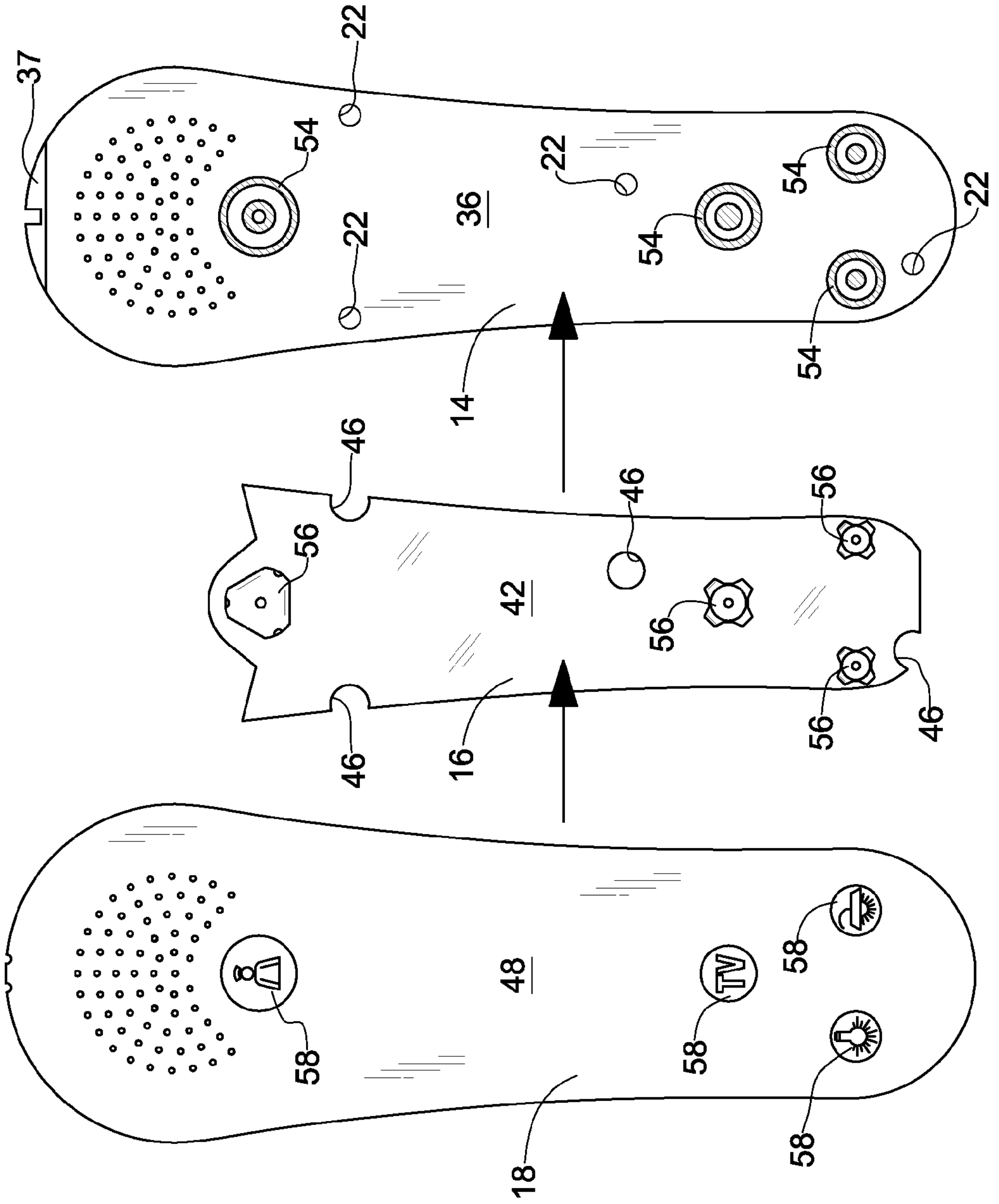
FIG. 2 is a top plan view showing a printed circuit board, a dome layer, and an overlay of the electronic device in greater detail.
Figure 3:
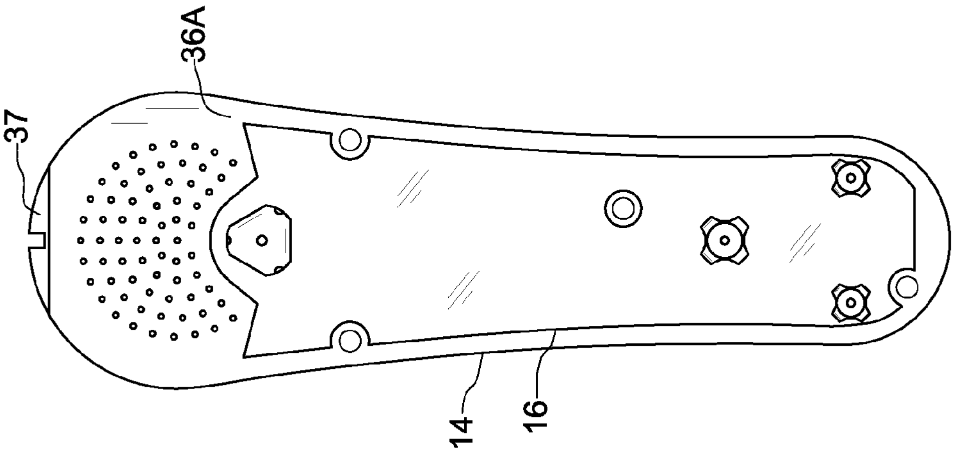
FIG. 3 is a top plan view of the dome layer adhered to the printed circuit board.

Referring also now to FIGS. 2 and 3, it will be seen that outward surface 36 of PCB 14 may include one or more switch traces 54 associated with pushbutton control switches enabling a user to enter commands to the device. Dome layer 16 is arranged adjacent outward surface 36 of PCB 14. Dome layer 16 includes a nonconductive sheet 42 and at least one conductive switch dome 56 attached to the sheet. Sheet 42 may be a thin polyester layer with adhesive only on its inward surface 44 (FIG. 1) to adhere the sheet to outward surface 36 of PCB 14 as shown in FIG. 3. Each switch dome 56 is applied to adhesive surface 44 of sheet 42 and positioned to register with a corresponding switch trace 54 on the PCB, wherein the switch dome is operable to close the switch trace by applying pressure to the switch dome.

Overlay 18 is arranged adjacent dome layer 16 and covers the dome layer to provide switch button embossing, switch graphics, and electrical isolation. Overlay 18 may be a polyester layer having an external surface 48 and an internal surface 50 (FIG. 1). Overlay 18 may have an electrical insulation voltage rating greater than 25 kV, however this property is subject to design choice depending upon the specific application. Overlay 18 includes a switch graphic 58 on external surface 48 at a location corresponding to an associated switch dome 56 of the dome layer. The switch graphic 58 may indicate a function of the switch button to the user, and may include alphanumeric characters or a word. In a commercial embodiment of the invention, the overlay 18 is embossed in the region of each switch graphic 58 and switch dome 56 to provide a more user-friendly tactile push button. The embossing may include Braille characters to assist blind patients.

Figure 5:
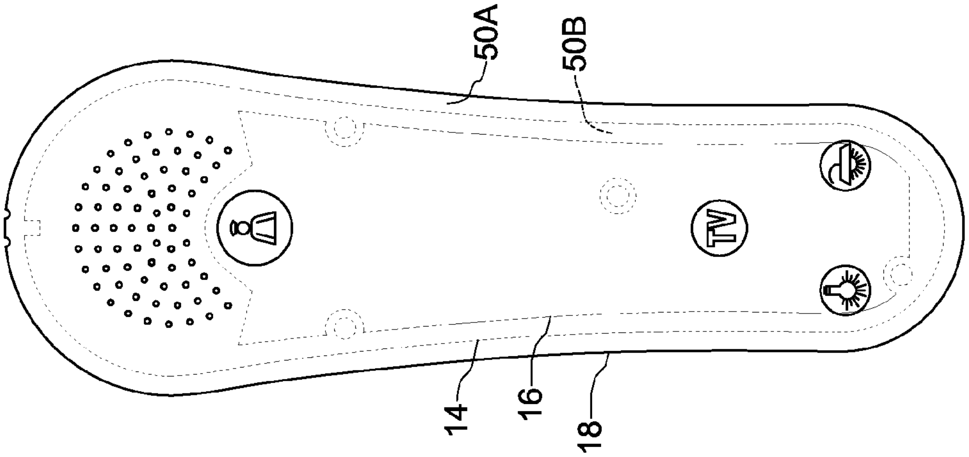
FIG. 5 is a top plan view of the overlay adhered to the printed circuit board overtop the dome layer.
Figure 4:
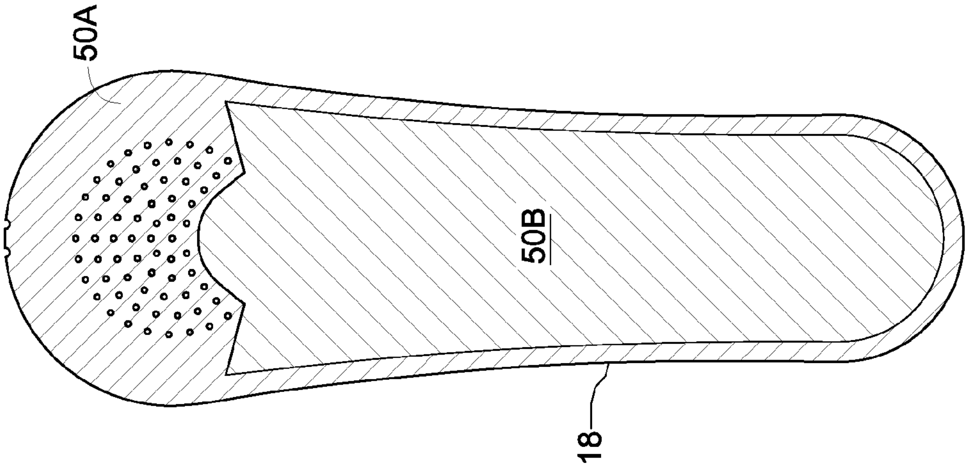
FIG. 4 is a plan view of an internal surface of overlay.

As seen in FIG. 4, the internal surface 50 of overlay 18 may include an adhesive portion 50A and a non-adhesive portion 50B. Adhesive portion 50A adheres to shell 12 and/or PCB 14, but does not adhere to dome layer 16. Dome layer 16 is covered by non-adhesive portion 50B, such that overlay 18 and dome layer 16 remain unattached to one another. Accordingly, overlay 18 may be fixed to the outward surface 36 of PCB 14 by adhesive at a portion of outward surface 36 not covered by dome layer 16. As represented in FIG. 5, adhesive portion 50A may extend beyond a peripheral region of PCB 14 so that it adheres to both the peripheral region of the PCB and to the rim surface 34 of shell 12.

The present invention extends to a method of making electronic device 10. The method generally comprises the steps of providing rigid shell 12 defining interior space 15 and opening 30 communicating with the interior space; providing rigid PCB 14 including electronic circuitry for operation of the device; and fixing the PCB to the shell such that the PCB covers the shell opening, wherein the shell and the PCB cooperate with one another to form a rigid enclosure assembly for the electronic device. A peripheral edge of the PCB may be arranged to oppose an inner surface of the shell.

According to another aspect of the inventive method, PCB 14 includes outward surface 36 having switch trace 54 thereon, and the inventive method further comprises the steps of providing dome layer 16 including nonconductive sheet 42 and switch at least one dome 56 attached to the sheet; fixing dome layer 16 to outward surface 36 of PCB 14 such that the switch dome is operable to close the switch trace; providing overlay 18 overlay including at least one switch graphic 58; and fixing overlay 18 to at least one of the shell 12 and the outward surface 36 of PCB 14 such that the switch graphic 58 is at a location corresponding to the switch dome 56, wherein the overlay 18 is unattached to dome layer 16. The dome layer 16 and the overlay 18 may be fixed to the outward surface 36 of PCB 14 by adhesive at different portions of the outward surface 36. Overlay 18 may also be fixed to shell 12 by adhesive. The steps mentioned in this paragraph also represent an improved method of making electronic device 10 for a health care setting, independently of the steps for constructing the rigid enclosure assembly described in the immediately preceding paragraph.

The present invention eliminates the need for a second rigid piece to form an enclosure assembly by using the PCB for structural function in addition to electronic function.

Moreover, the use of a dome layer and an overlay that are unattached to one another reduces cost, improves tactile feel of the buttons, and facilitates servicing of the device. Cost is reduced due to the fact that the dome layer 16 carries only the metal switch domes 56, whereby the dome layer may be configured for use with a large number of corresponding overlays 18. This reduces the number of different part numbers for manufacturing specifications. Tactile feel is improved because the user feels the entire tactile feel of the metal dome 56 itself, which was not the case with prior art switch membranes where the overlay and switch dome were physically coupled to one another. Serviceability is improved because only the overlay 18 needs to be discarded and replaced when the device is opened up, and the dome layer 16 including costly metal domes 56 can remain and be reused.

With regard to serviceability, the present invention is further embodied by an improved method for servicing an electronic device of a type comprising a PCB including a switch trace, a switch dome operable to close the switch trace, and an overlay including a switch graphic at a location corresponding to the switch dome. The servicing method of the present invention comprises the steps of removing the overlay 18 from the device 10 without removing the switch dome 56 from the device 10; performing a service operation; and fixing a replacement overlay different from the removed overlay on the device overtop the original switch dome 56.

Modifications and other embodiments of the inventions set forth herein will be apparent to one skilled in the art to which these inventions pertain in light of teachings presented in the present specification. Therefore, the inventions are not to be limited to the specific embodiments disclosed, and modifications and other embodiments are intended to be included within the scope of the appended claims.

PARTS LIST

10 Electronic device (pillow speaker)
12 Shell
12A First shell portion
12B Second shell portion
13 Ultrasonic weld seam
14 Printed circuit board (PCB)
15 Interior space of shell
16 Dome layer
18 Overlay
20 Fastener receptacles
22 Fastener holes through PCB
24 Fasteners
26 Cord passageway
28 Speaker mount
30 Shell opening
32 Support surface for PCB
33 Inner surface of shell
34 Rim surface of shell
35 Retainer tab
36 Outward surface of PCB
36A Portion of outward surface of PCB not covered by dome layer
38 Inward surface of PCB
40 Peripheral edge of PCB
42 Nonconductive sheet of dome layer
44 Adhesive surface of nonconductive sheet
46 Cut-out regions of nonconductive sheet
48 External surface of overlay
50 Internal surface of overlay
50A Adhesive portion of internal surface of overlay
50B Non-adhesive portion of internal surface of overlay
54 Switch traces on outward surface of PCB
56 Switch domes of dome layer
58 Switch graphics of overlay

What is claimed is:

1. An electronic device for use in a health care setting, the device comprising:

a rigid shell defining an interior space and an opening communicating with the interior space; and a rigid printed circuit board fixed to the shell, the printed circuit board covering the opening and including electronic circuitry for operation of the device, wherein the shell and the printed circuit board cooperate with one another to form a rigid enclosure assembly for the electronic device, thereby avoiding the need for a two-piece shell to enclose a separate printed circuit board.

2. The electronic device according to claim 1, wherein the shell includes a recessed support surface near the opening for supporting the printed circuit board by contact with an inward surface of the printed circuit board.

3. The electronic device according to claim 1, wherein a peripheral edge of the printed circuit board opposes an inner surface of the shell.

4. The electronic device according to claim 1, wherein the printed circuit board is at least 3.5 mm thick.

5. The electronic device according to claim 1, wherein the printed circuit board is fixed to the shell by a plurality of threaded fasteners.

6. The electronic device according to claim 1, wherein the shell is formed of molded plastic.

7. The electronic device according to claim 6, wherein the shell includes an overhanging tab arranged to engage an outward surface of the printed circuit board.

8. The electronic device according to claim 1, wherein the printed circuit board includes an outward surface having a switch trace thereon, and the electronic device further comprises:

a dome layer adjacent the out ward surface of the printed circuit board, the dome layer including a nonconductive sheet and a switch dome attached to the sheet, wherein the switch dome is operable to close the switch trace; and an overlay adjacent the dome layer, the overlay including a switch graphic at a location corresponding to the switch dome.

9. The electronic device according to claim 8, wherein the electronic device is a pillow speaker.

10. An electronic device for use in a health care setting, the device comprising a printed circuit board fixed to a housing shell, the printed circuit board including an outward surface having a switch trace thereon, wherein the improvement comprises:

a dome layer fixed to the outward surface of the printed circuit board, the dome layer including a nonconductive sheet and a switch dome attached to the sheet, wherein the switch dome is operable to close the switch trace; and an overlay adjacent to the dome layer and fixed to at least the outward surface of the printed circuit board, the overlay being unattached to the dome layer, wherein the overlay includes a switch graphic at a location corresponding to the switch dome, wherein the dome layer is fixed to the outward surface of the printed circuit board by adhesive and covers a portion of the outer surface, and the overlay is fixed to the outward surface of the printed circuit board by adhesive at another portion of the outward surface not covered by the dome layer.

11. The electronic device according to claim 10, wherein the overlay is fixed to the housing shell by adhesive.

12. The electronic device according to claim 11, wherein the electronic device is a pillow speaker.

* * * * *